Jan. 21, 1964 K. K. N. CHANG 3,119,074
TRAVELING WAVE SEMICONDUCTOR AMPLIFIER AND CONVERTER
Filed July 11, 1961
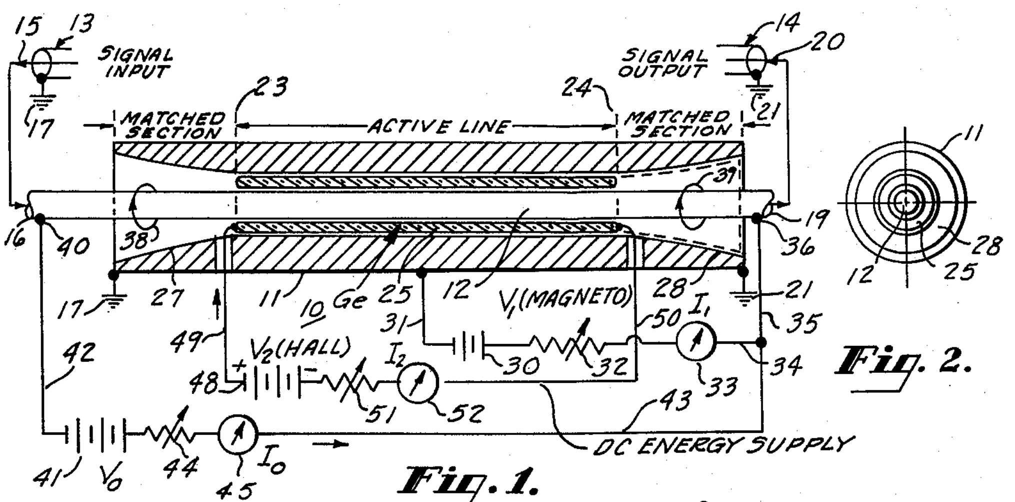
FIG. 1, FIG. 2
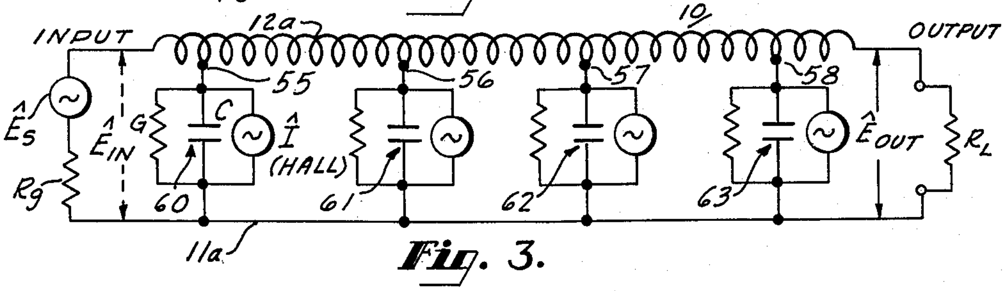
FIG. 3
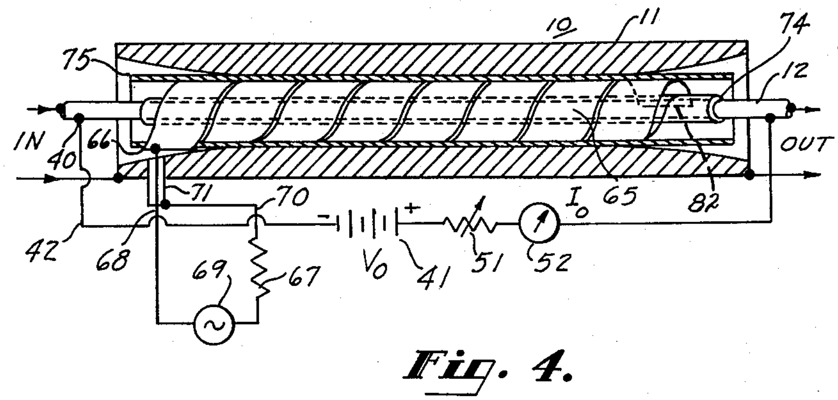
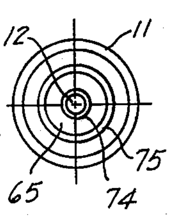
FIG. 5.
FIG. 4.
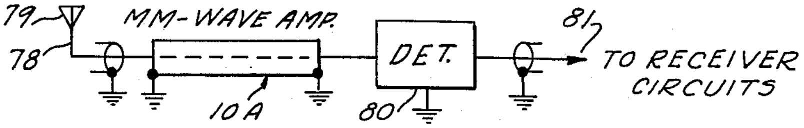
FIG. 6.
INVENTOR.
KERN K.N. CHANG
BY Eugene M. Whitacre
ATTORNEY 3,119,074
Patented Jan. 21, 1964

3,119,074

TRAVELING WAVE SEMICONDUCTOR AMPLIFIER AND CONVERTER

Kern K. N. Chang, Princeton, N.J., assignor to Radio Corporation of America, a corporation of Delaware Filed July 11, 1961, Ser. No. 123,314
6 Claims. (Cl. 330—5)

The present invention relates to high-frequency signal translating systems, and more particularly to high-frequency traveling-wave signal translating systems which operate in the microwave and millimeter-wave frequency ranges.

It is an object of this invention to provide an improved traveling-wave high-frequency signal translating system.

It is also an object of this invention to provide an improved traveling-wave signal translating system which may effectively utilize semiconductor or solid-state elements in transmission line or coaxial-line structures as active signal translating means.

In the signal translating system of the present invention, signal amplification and conversion or modulation may be attained in a transmission line structure comprising a pair of substantially-parallel or coaxial conductors using a semiconductor element or body located between the conductors as the medium for electromagnetic wave propagation. The semiconductor material is preferably magneto-resistive whereby the traveling-wave signal translating system, whether amplifier, converter or modulator, may utilize Hall-effect and magneto-resistance control of the semi-conductor element for impedance magnification and signal amplification along the transmission line.

Accordingly, it is a further object of this invention to provide a solid-state traveling-wave signal translating system which utilizes Hall-effect and magneto-resistance control for effective signal amplification or conversion.

The general theory of Hall-effect and magneto-resistance is well known. In the past, Hall-effect and magneto-resistance devices have been suggested for use at audio frequencies. In high-frequency devices however it is necessary to use a semi-conductor material with extremely high current carrier mobility. Semiconductor materials which are at present available do not have mobilities sufficiently high for the desired use. Furthermore even if such materials were available, a further difficulty arises in practice in that with a high mobility material, an extremely low-impedance circuit must be used.

In accordance with the invention, this difficulty is overcome by utilizing the Hall-effect and magneto-resistance control at microwave and higher frequencies for signal transmission, in a traveling-wave circuit or transmission line with a continuous and homogeneous active semiconductor medium therein for electromagnetic wave propagation. The active medium is provided by presently available semiconductor materials which do not have extremely high current carrier mobility. It has been found that such a system provides high-frequency signal amplification and frequency conversion. Signal gain is attained through the magneto resistance operation of the semiconductor medium between the transmission line conductors, and the Hall-effect is used to raise the impedance of the line or circuit for constant input circuit impedance and higher signal gain or conversion.

The interaction which results in signal amplification or translation takes place between the signal or R.-F. magnetic field and a pump field, either D.-C. or R.-F., which are applied to the transmission-line structure including the semiconductor medium. Thus a strong R.-F. field is desirable in the semiconductor medium for a given amount of available signal energy applied to the input end of the transmission-line structure. This is accomplished by a coaxial-line structure, for example, with a small spacing between the inner and outer conductors or conductor elements, and with a center portion, as the active line, filled with semiconductor material such as germanium. The pump field, which as above noted may be provided by either direct current or an R.-F. signal, is applied between the inner conductor and the outer conductor. Furthermore, a direct current is passed through the center conductor to produce a circumferential or circular D.-C. or fixed magnetic field about the conductor and in the semiconductor medium.

In cases where an A.-C. or R.-F. pump signal is used for frequency conversion, this signal can be sent through the transmission-line structure on a helical semiconductor element, with the semiconductor element insulated from the inner and outer line conductors. These and other forms of the invention will be described with reference to the accompanying drawings, for a further understanding of the invention, and its scope is pointed out in the appended claims.

In the drawings,

FIGURE 1 is a view, partly in cross-section, of a high-frequency signal transmission-line structure and associated circuit diagram for a signal translating system embodying the invention;

FIGURE 2 is an end view of the transmission-line structure of FIGURE 1 further showing details of construction;

FIGURE 3 is a schematic circuit diagram representing an equivalent circuit for the transmission-line structure of FIGURE 1, to illustrate certain operational features thereof;

FIGURE 4 is a view, partly in cross-section, of a further signal transmission-line structure and associated circuit diagram, representing a modification of the structure and circuit of FIGURE 1, as a further embodiment of the invention;

FIGURE 5 is an end view of the transmission-line structure of FIGURE 4, showing further details of construction thereof, and FIGURE 6 is a schematic diagram of a portion of a high-frequency signal receiver system, showing one use of the invention in the form represented by the circuit and element of FIGURE 1.

Referring to the drawings, wherein like elements throughout the various figures are referred to by like reference characters, and referring particularly to FIGURES 1 and 2, a high-frequency signal amplifier is provided by a high-frequency signal transmission line 10 in the form of a coaxial-line structure having an outer conductor 11 and an inner conductor 12 coextensive for any suitable length and providing a signal translating connection between a signal input circuit or line 13 and a signal output circuit or line 14. The conductor 15 of the signal input line 13 is connectiond to the left or input and 16 of the inner conductor 12 of the transmission line 10. The outer conductor of the input line 13 is connected to the corresponding end of the outer conductor 11 through common or system ground connections indicated at 17. Likewise the output end 19 of the center conductor 12 is connected to the center conductor 20 of the output line 14. The outer conductor of the output line 14 is connected through common or system ground connections 21 to the output end of the outer conductor 11, as indicated.

The center portion or active line of the coaxial-line structure 10 is indicated between the dotted parallel lines 23 and 24 and includes, between the spaced conductors, 11 and 12, a cylindrical or tubular homogeneous body 25 of semiconductor material, such as n-type germanium. This is in contact with both conductor elements and fills the space between them over the active length of the line referred to. By way of example, the inner conductor may comprise 20 mil molybdenum wire which is immersed in molten semiconductor material such as germanium, indium antimonide or the like. After cooling the semiconductor material adhering to the wire is etched to the proper dimension which may be 5 mils of thickness. The outer conductor may then be added in any suitable manner.

The active line is matched at each end with a tapered coaxial line section formed, in the present example, by belling or internally tapering the ends of the outer conductor 11, as indicated at 27 and 28 respectively, for the input and output ends of the line structure. In the present example it may be considered that the line sections are tapered to provide substantially a 50-ohm input and output impedance matching for the signal input and output lines 13 and 14 respectively.

Energy for signal amplification is provided by a pump field which may be either direct-current or alternating-current (signal). In the present example the pump field is of the direct-current type and is provided by current from a battery 30 representing any suitable direct-current source $V_1$, and is applied radially through the semiconductor body 25 between the inner and outer conductors 12 and 11. To this end the source $V_1$ or battery 30 is connected by a conductor 31 with the outer conductor 11 of the transmission line 10 and on its opposite side through a control resistor 32, a milliammeter 33 and circuit conductors 34 and 35, with the inner conductor 12 at the output end as indicated by the terminal 36. The resistor 32 is variable, as indicated, to adjust the current from the source $V_1$ as read by the meter 33, to a desired initial value as will hereinafter be referred to.

A circumferential or circular direct-current or fixed magnetic field is also established about the inner conductor 12, as indicated by the arrowed circular lines 38 and 39. This field is produced in the semiconductor body 25 by current flowing through the center conductor 12 from the end connection terminal 36 to an opposite end connection terminal 40 on said conductor. This current is supplied by a suitable direct-current source $V_0$, such as a battery 41. The latter is connected to the terminal 40 through a supply lead 42, and to the terminal 36 through a second supply lead 43 in which is located a series variable control resistor 44, and indicating milliammeter 45, for adjusting the current flow from the supply source $V_0$.

For Hall-effect impedance magnification a third source of energy $V_2$ is provided and this is likewise a direct-current source provided by a battery 48, representing any suitable D.-C. supply source of constant voltage. This is connected to opposite ends of the cylindrical or tubular body 25 of semiconductor material through supply leads 49 and 50. A series variable control resistor 51 and indicating milliammeter 52 are connected in the lead 50 for adjusting the current flow through the semiconductor body 25.

The Hall-effect-magneto-resistance traveling-wave or transmission-line system of the present invention for signal amplification or conversion at high frequencies is not limited to high mobility semiconductor materials for the active medium therein. Available semiconductor material of ordinary mobility may be used. The line structure includes a pair of coextensive conductors or conductor elements in substantially parallel relation, and although preferably in the form of a coaxial line as shown in the present example, it is not limited thereto.

The signal or magnetic R.-F. field $\hat{B}_\phi$ about the inner conductor 12 modulates the circumferential or circular D.-C. or fixed magnetic field $B_0$ provided by the current from the source $V_0$. Also about the center conductor 12 and through the semiconductor body or element 25 are the radial R.F. electric field $\hat{E}_r$ produced by the signal and Hall-effect voltage differential between the inner and outer conductors, and the radial D.-C. electric field $E_0$ produced by the voltage from the pump or energy supply source $V_1$ in the present example, and which provides the magneto-resistance current and field.

The radial R.-F. electric field $\hat{E}_r$ for the signal and magneto resistance effect amplification provides for a signal voltage gain along the line from the input end 16 to the output end 19. This results from incremental magneto-resistance voltages established between the conductors 12 and 11 by reason of the current flowing radially through the semiconductor body 25 from the source 30 in the presence of the signal-variable circumferential or circular magnetic fields resulting from the applied signal and D.-C. current flow (from the source $V_0$) through the center conductor 12.

Referring to FIGURE 3 along with FIGURES 1 and 2, the equivalent transmission line circuit is shown, in which the inner conductor 12 is represented by the elongated inductor element **12*a* and the outer conductor 11 is represented by the elongated conductor 11*a***. The output end of the line is connected to a load element $R_L$ and the input end is connected with a signal source such as a signal generator $\hat{E}_s$ having an internal impedance or resistance $R_g$. With this line, for a given input voltage $\hat{E}_{in}$ from the source $\hat{E}_s$, a resultant amplified output voltage $\hat{E}_{out}$ and output current will appear across the load $R_L$ at the output end of the line.

Four voltage points, 55, 56, 57 and 58 on the inner conductor with respect to the outer conductor may be assumed in the circuit of FIGURE 3, for purposes of illustrating the operation of the semiconductor body in the structure shown in FIGURE 1. Between the voltage points and the outer conductor represented by the conductor **11*a* in FIGURE 3, the semiconductor material provides a shunt capacitance C and conductance G together with a magneto resistance voltage or R.-F. current source $\hat{I}$ in each one of four equivalent circuit elements 60, 61, 62 and 63 respectively for the voltage points 55, 56, 57 and 58, progressively along the transmission line. It will be recognized that the semiconductor body 25 actually provides an infinite number of such shunt circuits linearly distributed between the inner and outer conductors 11 and 12**.

When an R.-F. signal is applied at the input end of the line, the circumferential D.-C. magnetic field $B_0$ through the semiconductor body is modulated by the circumferential signal magnetic field $\hat{B}_0$. This modulates the resistance of the semiconductor body 25 appearing between the conductors 12 and 11 at the voltage point 55, thereby providing an incremental increase in the signal current and voltage at the voltage point 55. At least a portion of the incremental increase in signal current and voltage flows down the line toward the output end to enhance the forward wave of the applied signal.

At the voltage point 56, the amplified signal current produces a greater circumferential magnetic field to enhance the magneto resistance action of the semiconductor body 25 at this point. Here again an incremental increase in signal voltage and current is produced over that which was applied thereto. The action continues in a similar manner down the line at the voltage points 57 and 58 wherein voltage current increases are added incrementally along the line to the signal voltage existing between the inner and outer conductors, so that both the current and voltage on the line gradually increases from the input end 16 to the output end 19. Thus it will be seen that the output voltage $\hat{E}_0$ and output current $\hat{I}_0$ is greater than the input voltage $\hat{E}_{in}$ and input current $\hat{I}_{in}$ respectively, by reason of the amplification provided progressively along the length of the semiconductor body or as between the circuit elements 60, 61, 62 and 63 progressively. Four wave components appear in the traveling-wave line. The applied signal caused two of these components; a forward wave component and a backward wave component which will be much smaller than the forward wave component. The magneto resistance currents and voltages produce the other two wave components; a forward component which adds to the forward wave due to the signal to produce amplification; and a backward wave component which attenuates the backward wave component of the signal. Since the amplified wave appears only at the input terminals of the amplifier of the invention input and output terminals are effectively isolated for signal voltages.

Thus a microwave signal applied through the input conductor 13 of FIGURE 1 is derived from the traveling-wave signal translating system at the output conductor 14 amplified by reason of the magneto-resistance effect opeartion of the semi-conductor body 25 in response to the applied currents from the D.-C. field and magneto resistance current sources $V_0$ and $V_1$ respectively. The signal amplification results from interaction between the R.-F. magnetic field and the D.-C. current flow or field through the body of semiconductor material as a magneto resistance effect element. Thus, as mentioned hereinbefore, the maximum R.-F. signal field is desirable for a given amount of available signal energy, and this is accomplished, as shown in FIGURE 1, by a coaxial-line structure with a relatively small spacing between the inner and outer conductor elements and with the center portion of the line filled with a body of semiconductor material, such as germanium for example. Other materials of this type, having magneto-resistive characteristics, may be used, such as silicon, gallium arsenide, indium arsenide, and indium antimonide.

Semiconductor materials of this type which have reasonably high mobility provide low resistance and low impedence normally, and since, for reasons hereinbefore stated, the spacing between the conductors and the thickness of the body therebetween is relatively small so that the input impedance of the amplifier would ordinarily be extremely low. However, means are provided for increasing the impedance Z between the conductors 11 and 12 or reducing the admittance Y, of which the conductance G forms a part. This is provided by applying Hall-effect control of the material through operation of the pump source 48 or $V_2$ which provides a longitudinal D.-C. field through the semiconductor body 25. This is substantially at right-angles or orthogonal to the magnetic fields $B_0$ and $\hat{B}_\phi$ provided about the center conductor 12 by the fixed D.-C. current and the signal flow, as represented by the circular flux lines 38 and 39 of FIGURE 1.

The reason for the increased input impedance will be understood by observing that a Hall voltage is produced between the conductors 11 and 12 that tends to drive current through the semiconductor body in a direction opposite to that of signal current flow. This reduces the net signal current flow through the semi-conductor body, so that the device appears effectively as a high impedance.

It will be noted that the current source $V_2$ applies a longitudinal field to the semiconductor body 25. Signal current flowing along the conductor 12 produces a circumferential field which passes through the semiconductor body 25, and hence causes a Hall voltage to be produced between the conductors 11 and 12. The Hall voltage is of a polarity to produce currents through the semiconductor body 25 at incremental points therealong which are in the opposite direction to currents produced by the signal voltage appearing between that point along conductors 11 and 12. The net effect is to reduce the signal current flow through the semiconductor body 25, and hence make the device 10 appear as a high impedance element to signal current input and output circuits. The higher impedance effectively increases the gain of the system.

From the foregoing description it will be seen that the traveling-wave signal translating system of the present invention utilizes Hall-effect and magneto-resistance control of a semiconductor element along a high-frequency or microwave signal transmission line having relatively closely-spaced conductors for increasing the strength of the signal field and thereby obtaining increased signal amplification. Signal conversion may likewise be obtained in a similar circuit or line configuration as shown in FIGURES 4 and 5 to which attention is now directed.

In the system of FIGURES 4 and 5, the inner conductor 12 and the outer conductor 11 are provided with an interposed body or element 65 of semiconductor material which is in the form of a helical conductor or strip and insulated therefrom. The turns of the element 65 are suitably spaced apart as indicated. The input end 66 is connected with a signal supply conductor 68 from a suitable signal source or generator 69, while the terminal end 82 is without any circuit connection. The source or generator 69 is also connected through a return conductor 70 and its internal resistance, represented by the resistor 67, with a shield conductor 71 for the signal supply conductor 68. The shield conductor 71 is connected with the outer conductor 11 of the line structure 10. The helical semiconductor 65 is connected to receive signals from the source 69 as an R.-F. pump for frequency conversion. The source 69 serves to provide both the axial and radial field components for Hall effect and magneto resistance control of the amplifier. In this respect, the source 69 is the A.-C. equivalent of the sources $V_1$ and $V_2$ of FIGURE 1. Current from the source 69 flows helically through the helical semiconductor 65 from the input end toward the output end to produce an axial electric field, and back to the source 69 through the capacitance across the insulators 74—75 to ground to produce a radial electric field. The capacitive return paths include the outer conductor 11 of the device in parallel with the center conductor 12 and the input and output circuits to ground.

In the present example, the insulation of the helical semiconductor body 65 from the inner and outer conductors is provided by an inner sleeve or layer of insulating material 74 surrounding the inner conductor 12, and an outer sleeve or tube of insulating material 75 which lines the inner wall of the outer conductor 11. The body of semiconductor material 65 is in contact with both of the insulating sleeves 74 and 75, thereby to maintain the structure substantially coaxial with respect to its elements, as indicated in FIGURE 5.

The helical conductor 65 has such a pitch angle that the slow wave formed travels with the same velocity as the TEM mode in the coaxial line shown, or any mode as provided for other transmission line structures for the same purpose comprising two spaced conductor elements.

As mentioned above, the signal magnetic field $\hat{B}_0$ modulates the resistance of the helical semiconductor body 65. This causes the amplitude of the magneto resistance current to be modulated. The magneto resistance current flows in the path from the generator 69 through the helical semiconductor 65, the capacitance to the inner conductor 12, the output circuit to ground 11 and back to the generator 69. In other words, the magneto resistance current of generator 69 frequency is modulated at the signal frequency. In like manner the Hall current between the inner and outer conductor is also varied at signal frequency and the generator 69 frequency.

This results in modulation or mixing, whereby signal conversion is accomplished in the circuit of FIGURE 4 to provide at the output end 12 of the line an intermediate-frequency signal, or like signal corresponding to the input and pump signal frequencies. Thus the system may be used for signal mixing or conversion as well as amplification, and in many cases for effective operation in the microwave or millimeter-wave ranges which are currently of interest in many fields of operation relating to high-frequency signal transmission, such as microwave receiver and other millimeter wave applications.

As indicated in FIGURE 6, to which attention is now directed, a transmission line 10A providing a millimeter wave amplifier similar to that shown at 10 in FIGURE 1, may be connected between a shielded input signal conductor 78, from a signal source such as an antenna 79, and a detector circuit 80, for example, of a microwave receiver. For the detector circuit 80, a shielded output conductor 81 is provided for connection to the remainder of the receiver circuits, as indicated. This represents only one of its many uses, although the system of the present invention may be used as an amplifier, or as a converter to supply signals to a suitable intermediate frequency amplifier direct from an antenna or other input device such as that shown in FIGURE 6, the detector 80 then being an amplifier for the intermediate-frequency output signal as would be derived from a device such as that shown in FIGURES 4 and 5.

From the foregoing description it will be seen that a Hall-effect magneto-resistance device suitable for operation at high frequencies, and in the microwave or millimeter-wave signal ranges, can be attained in a traveling wave circuit incorporating a continuous and homogeneous active semiconductor medium as herein shown and described. The active medium may be provided by any semiconductor material of reasonable mobility while obtaining relatively high signal amplification and frequency conversion and a relatively high impedance or high resistance in the traveling-wave circuit means, as is desirable for higher gain.

Thus a new microwave traveling-wave amplifier or converter utilizing the Hall-effect and magneto-resistance control of a semiconductor element along a transmission line for effective signal amplification or conversion can be attained at relatively low cost because of the simplicity of the traveling-wave structure. The high-frequency signal translating system of the present invention thus includes as the active translating means therein, a novel transmission line or coaxial line structure using a semi-conductor element or body as the medium for electromagnetic wave propagation. An improved solid-state traveling-wave high-frequency or millimeter-wave signal translating system is attained by simplified relatively low-cost means.

What is claimed is:

1. A traveling-wave signal translating system comprising in combination, a signal transmission-line structure including a pair of transmission-line conductor elements, means for applying an input signal to one end of said structure in connection with the input ends of said conductor elements, means for deriving an output signal from the opposite end of said line structure in connection with the output ends of said conductor elements, a semi-conductor element extending along and between the conductor elements of the transmission line structure, means for establishing a transverse magnetic bias field through the semiconductor element and additional means for applying control currents longitudinally through said semiconductor element and transversely thereof between the conductors, the direction of said longitudinal current being such that a change in magnetic field through said semiconductor element tends to produce a change in the transverse current due to Hall-effect in a direction tending to maintain the transverse control current constant as the magneto-resistance of said semiconductor element changes due to said change in magnetic field, to thereby increase the effective impedance between said conductor elements.

2. A high-frequency signal translating system as defined in claim 1, wherein the transmission line structure is of the coaxial-line type having inner and outer conductor elements, and wherein the semiconductor element is substantially tubular in form and filling the space between the transmission line conductor elements over a major portion of the structure between the ends thereof.

3. A high frequency signal translating system as defined in claim 2, wherein the means for establishing the transverse magnetic bias includes a first source of unidirectional potential connected to spaced points along said inner conductor.

4. A high frequency signal translating system as defined in claim 2, wherein said additional means includes second and third sources of unidirectional potential each having positive and negative terminals, said positive terminal of said second source being connected to one of said inner and outer conductors and said negative terminal of said second source being connected to the other of said inner and outer conductors to provide the transverse control current, said positive and negative terminals of said third source of unidirectional potential being connected respectively to opposite ends of said semiconductor element in such relation that a change in the magnetic field through said semiconductor element produces a Hall voltage between said inner and outer conductors which tends to oppose changes in the transverse current due to magneto-resistance effect to thereby increase the effective impedance between said inner and outer conductor elements.

5. A high-frequency translating system as defined in claim 2, wherein the transmission line structure is of the coaxial-line type having inner and outer conductor elements, and wherein the semiconductor element between said conductor elements is helical in form and insulated therefrom.

6. A high frequency signal translating system as defined in claim 1, wherein the means for applying control currents longitudinally through said semiconductor element and transversely thereof includes a high frequency energy source.

References Cited in the file of this patent

UNITED STATES PATENTS

| | | |
|---|---|---|
| 2,532,157 | Evans | Nov. 28, 1950 |
| 2,743,322 | Peirce et al. | Apr. 24, 1956 |
| 2,760,013 | Peter | Aug. 21, 1956 |
| 2,777,906 | Shockley | Jan. 15, 1957 |
| 2,887,665 | Suhl | May 19, 1959 |
| 2,911,554 | Kompfner et al. | Nov. 3, 1959 |
| 2,936,369 | Lader | May 10, 1960 |
| 3,008,089 | Uhlir | Nov. 7, 1961 |
| 3,012,203 | Tien | Dec. 5, 1961 |
| 3,051,908 | Anderson et al. | Aug. 28, 1962 |

FOREIGN PATENTS

| | | |
|---|---|---|
| 1,168,080 | France | Aug. 28, 1958 |
| 811,049 | Great Britain | Mar. 25, 1959 |